(12) United States Patent
Takahashi

(10) Patent No.: US 11,430,636 B2
(45) Date of Patent: *Aug. 30, 2022

(54) PLASMA PROCESSING APPARATUS AND CLEANING METHOD

(71) Applicant: TOKYO ELECTRON LIMITED, Tokyo (JP)

(72) Inventor: Syuichi Takahashi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 156 days.

This patent is subject to a terminal disclaimer.

(21) Appl. No.: 16/700,383

(22) Filed: Dec. 2, 2019

(65) Prior Publication Data

US 2020/0105505 A1 Apr. 2, 2020

Related U.S. Application Data

(63) Continuation of application No. 14/730,318, filed on Jun. 4, 2015, now Pat. No. 10,497,545.

(30) Foreign Application Priority Data

Jun. 5, 2014 (JP) .................................. 2014-117030

(51) Int. Cl.
*H01L 21/00* (2006.01)
*C23C 16/00* (2006.01)
*H01J 37/32* (2006.01)

(52) U.S. Cl.
CPC .. *H01J 37/32532* (2013.01); *H01J 37/32091* (2013.01); *H01J 37/32862* (2013.01)

(58) Field of Classification Search
None
See application file for complete search history.

(56) References Cited

U.S. PATENT DOCUMENTS 6,334,983 B1 * 1/2002 Okayama ............... C23C 16/455
422/186.29
7,166,200 B2 * 1/2007 Saigusa ............. H01J 37/32009
204/298.01

(Continued)

FOREIGN PATENT DOCUMENTS

JP 2007-123796 A 5/2007
JP 2007-214512 A 8/2007

(Continued)

*Primary Examiner* — Sylvia MacArthur
*Assistant Examiner* — Michelle Crowell
(74) *Attorney, Agent, or Firm* — Weihrouch IP

(57) ABSTRACT

Disclosed is a plasma processing apparatus including: a processing container; a susceptor configured to serve as a lower electrode and mount a processing target substrate thereon; a shower head provided above the susceptor to supply a processing gas into the processing container; an upper electrode provided above the placing table; a high frequency power supply configured to apply a high frequency power to the susceptor to generate plasma of the processing gas within the processing container; and a DC voltage application unit configured to apply a DC voltage to the upper electrode. The shower head includes a UEL base, and a CEL provided on the UEL base at susceptor side, and an insulating portion provided between the UEL base and the CEL. The DC power supply applies the DC voltage to the CEL.

20 Claims, 9 Drawing Sheets

(56) References Cited

U.S. PATENT DOCUMENTS

| | | | |
|---|---|---|---|
| 8,070,911 B2 | 12/2011 | Himori et al. | |
| 8,789,493 B2* | 7/2014 | Ren | H01J 37/32009 |
| | | | 118/723 E |
| 10,497,545 B2* | 12/2019 | Takahashi | H01J 37/32862 |
| 2003/0032301 A1* | 2/2003 | Dhindsa | C23C 16/4586 |
| | | | 438/758 |
| 2003/0185729 A1 | 10/2003 | Ko et al. | |
| 2005/0000430 A1* | 1/2005 | Jang | C23C 16/45565 |
| | | | 118/715 |
| 2006/0081337 A1 | 4/2006 | Himori et al. | |
| 2006/0196604 A1* | 9/2006 | Moriya | C23F 4/00 |
| | | | 156/345.34 |
| 2006/0221540 A1 | 10/2006 | Himori et al. | |
| 2007/0068798 A1 | 3/2007 | Honda et al. | |
| 2007/0187038 A1 | 8/2007 | Ren et al. | |
| 2009/0242133 A1* | 10/2009 | Nakayama | H01J 37/32091 |
| | | | 156/345.44 |
| 2010/0117008 A1 | 5/2010 | Murakami | |
| 2011/0048453 A1 | 3/2011 | Honda et al. | |
| 2011/0088850 A1 | 4/2011 | Honda et al. | |
| 2012/0174866 A1* | 7/2012 | Huh | C23C 16/45559 |
| | | | 118/725 |
| 2012/0175062 A1* | 7/2012 | de la Llera | H01J 37/32091 |
| | | | 156/345.34 |
| 2014/0141619 A1 | 5/2014 | Sawada | |
| 2015/0047786 A1* | 2/2015 | Lubomirsky | H01J 37/32816 |
| | | | 156/345.1 |

FOREIGN PATENT DOCUMENTS

| | | |
|---|---|---|
| JP | 2008-78515 A | 4/2008 |
| JP | 2008-150680 A | 7/2008 |
| WO | 2014/078393 A1 | 5/2014 |

* cited by examiner

PRIOR ART

FIG.13

| NO. | TYPE OF TEST PIECE | | |
|---|---|---|---|
| | RECESS | FLAT SURFACE | HOLE |
| 1 | 850V | 1220V | 1350V |
| 2 | 730V | 1320V | 1830V |
| 3 | 880V | 1560V | 1690V |
| 4 | 770V | 1320V | 1620V |
| 5 | 790V | 1810V | 1450V |
| 6 | 880V | 1280V | 1320V |
| 7 | 800V | 1180V | 1610V |
| 8 | 900V | 1640V | 1210V |
| 9 | 790V | 1870V | 1240V |
| 10 | 760V | 1540V | 1450V |
| AVERAGE | 815V | 1474V | 1477V |
| MAX. | 900V | 1870V | 1830V |
| MIN. | 730V | 1180V | 1210V |

FIG.14

| ADHERED PRODUCT | APPLIED VOLTAGE | | | |
|---|---|---|---|---|
| | 0V | −50V | −100V | −150V |
| Al | 49.3% | 49.3% | 93.6% | 99.8% |
| Hf | 90.0% | 99.6% | 99.9% | 99.9% |

PLASMA PROCESSING APPARATUS AND CLEANING METHOD

CROSS-REFERENCE TO RELATED APPLICATIONS

This application is continuation of U.S. application Ser. No. 14/730,318, filed Jun. 4, 2015 which claims priority to Japanese Patent Application No. 2014-117030, filed on Jun. 5, 2014, the disclosures of which is incorporated herein in their entirety by reference, and priority is claimed to each of the foregoing.

TECHNICAL FIELD

Various aspects and exemplary embodiments of the present disclosure are related to a plasma processing apparatus and a cleaning method.

BACKGROUND

There is known a plasma processing apparatus that is provided with a processing container, an upper electrode provided within the processing container, and a lower electrode provided within the processing container and connected to a high frequency power supply. In such a plasma processing apparatus, a semiconductor wafer is mounted on the lower electrode, a processing gas is supplied into the processing container, and a high frequency power is applied to the lower electrode. Then, the processing gas within the processing container is turned into plasma by the high frequency power supplied into the processing container through the lower electrode so that, for example, ions, are generated, and a plasma processing such as, for example, an etching processing, is performed on the semiconductor wafer by, for example, the ions.

In the plasma processing apparatus, a reaction product produced from the processing gas containing a reaction gas is adhered to, for example, a side wall of the processing container or the upper electrode. When the reaction product attached to the side wall or the upper electrode is peeled off from the side wall or the upper electrode to form particles and the particles float within the processing container, some of the particles may be attached to the semiconductor wafer. The particles may cause a defect on, for example, a semiconductor device manufactured from the semiconductor wafer. Accordingly, it is necessary to remove the reaction product adhered within the processing container.

For example, there is known a cleaning method in which a negative direct current voltage is applied to the upper electrode and oxygen gas is introduced into the processing container so that oxygen ions and oxygen radicals are generated from the oxygen gas by the high frequency power applied to the lower electrode to cause the reaction product adhered to the upper electrode to react with either the oxygen ions or the oxygen radicals to be removed from the upper electrode.

SUMMARY

A plasma processing apparatus according to an aspect of the present disclosure includes: a processing container; a gas supply unit configured to supply a processing gas into the processing container; a placing table configured to serve as a lower electrode and mount a processing target substrate thereon; an upper electrode provided above the placing table; a plasma generation unit configured to generate plasma of the processing gas within the processing container by applying high frequency power to the placing table; and a direct current (DC) voltage application unit configured to apply a DC voltage to the upper electrode. The upper electrode includes a base member, a cover member provided on the base member at a side of the placing table, and an insulating portion provided between the base member and the cover member so as to insulate the base member and the cover member. The DC voltage application unit applies the DC voltage to the cover member.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 13 is a view representing an exemplary test result of a withstanding voltage.

FIG. 14 is a view representing an exemplary test result of a removal rate of an adhered product in relation to a DC voltage applied to a CEL (Cover Electrode).

DETAILED DESCRIPTION

Figure 1:
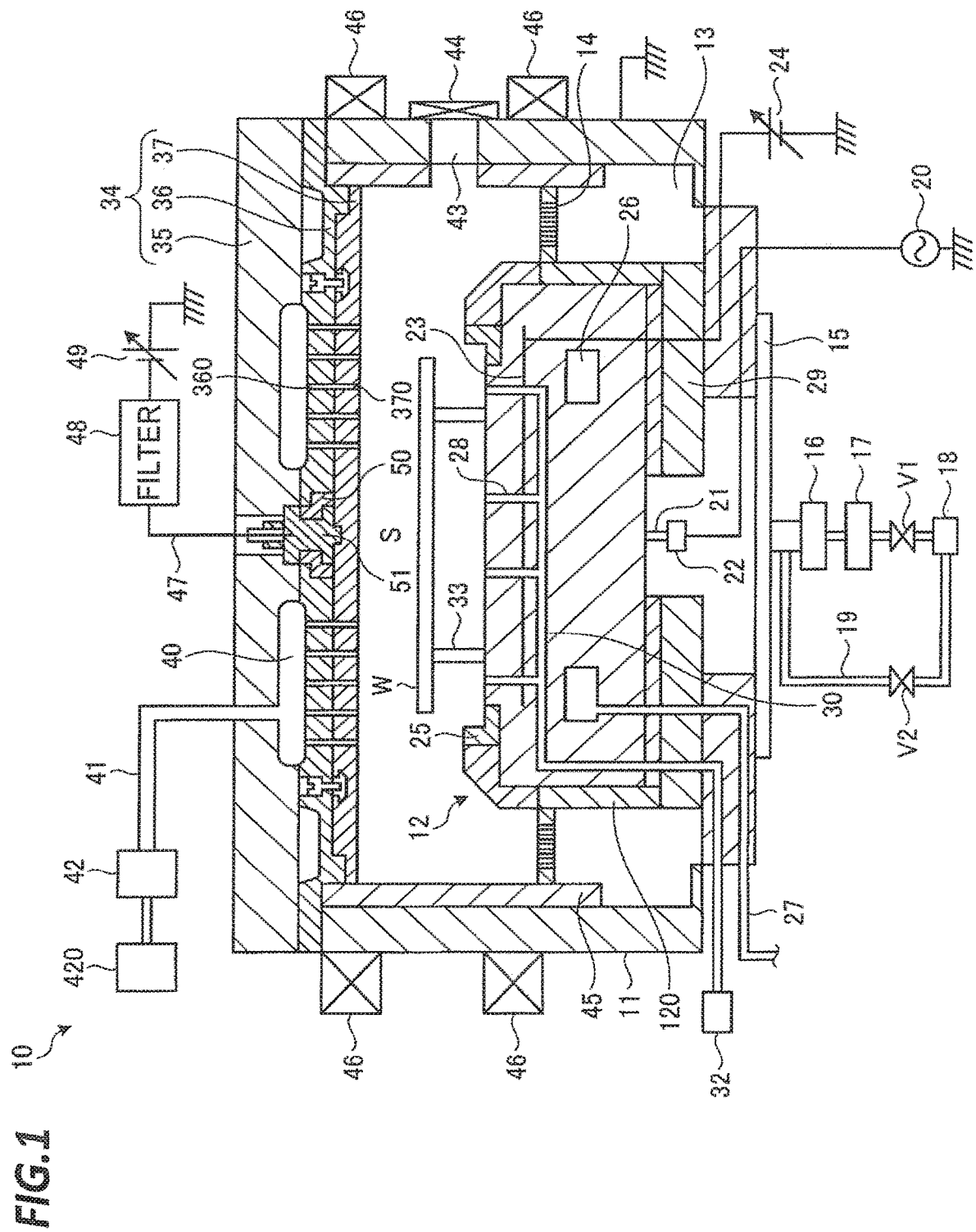
FIG. 1 is a vertical cross-sectional view illustrating an exemplary plasma processing apparatus according to an exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the above-described plasma processing apparatus that does not have a cleaning function, it is necessary to remove the reaction product adhered to the upper electrode by taking out and cleaning the upper electrode from the processing container. In order to improve the throughput of a process while preventing the pollution caused by particles, it is considered to add the cleaning function as described above to the plasma processing apparatus.

When the cleaning function as described above is added, the environment within the plasma processing apparatus may be changed from the environment of the process that has been performed until now. For example, the potential of the upper electrode with respect to the lower electrode may be changed as compared to that before the addition of the cleaning function in some cases.

Some plasma processing apparatuses are operated using a processing recipe established by repeating fine adjustments for various parameters over many years. In such plasma processing apparatuses, when the environment therein is changed, the processing recipe established through the adjustments up to now cannot be applied. For that reason, it is necessary to finely adjust various parameters in order to reproduce process characteristics which have been implemented by a combination of a plasma processing apparatus and a processing recipe which has been used up to now.

A plasma processing apparatus disclosed herein includes: a processing container; a gas supply unit configured to supply a processing gas into the processing container; a placing table configured to serve as a lower electrode and mount a processing target substrate thereon; an upper electrode provided above the placing table; a plasma generation unit configured to generate plasma of the processing gas within the processing container by applying high frequency power to the placing table; and a DC voltage application unit configured to apply a DC voltage to the upper electrode. The upper electrode includes a base member, a cover member provided on the base member at a side of the placing table, and an insulating portion provided between the base member and the cover member so as to insulate the base member and the cover member. The DC voltage application unit applies the DC voltage to the cover member.

In one exemplary embodiment of the plasma processing apparatus disclosed herein, the insulating portion may be an insulative coating formed on a surface of the base member.

In one exemplary embodiment of the plasma processing apparatus disclosed herein, the base member may be formed of aluminum, and the insulating portion may be an anodic oxide coating formed on the surface of the base member.

In one exemplary embodiment of the plasma processing apparatus disclosed herein, a radius of a protruding corner rounding formed on the placing table side surface of the base member may be in a range of 0.2 mm or more and 1.0 mm or less.

In one exemplary embodiment of the plasma processing apparatus disclosed herein, a withstanding voltage of the insulating portion may be 730 V or less.

In one exemplary embodiment of the plasma processing apparatus disclosed herein, the DC voltage application unit may apply a voltage in a range of more than −730 V and −150 V or less to the cover member.

A cleaning method disclosed herein includes: supplying a processing gas into a processing container; applying a DC voltage to an upper electrode within the processing container; and generating plasma of the processing gas within the processing container by applying a high frequency power to a placing table on which a processing target substrate is mounted. When applying the DC voltage, the DC voltage is applied to a cover plate in the upper electrode that includes a base plate, the cover plate provided on the base plate at a side of the placing table, and an insulating part provided between the base plate and the cover plate to insulate the base plate and the cover plate.

According to various aspects and exemplary embodiments of the present disclosure, it is enabled to achieve a plasma processing apparatus and a cleaning method, in which an effect according to addition of a cleaning function to an existing plasma processing apparatus on a process may be suppressed to be low.

Hereinafter, exemplary embodiments of a plasma processing apparatus and a cleaning method disclosed herein will be described in detail with reference to the accompanying drawings. The present disclosure is not limited to the exemplary embodiments disclosed herein. In addition, respective exemplary embodiments may be properly combined with each other without conflicting processing contents.

[Configuration of Plasma Processing Apparatus 10]

FIG. 1 is a vertical cross-sectional view illustrating an exemplary plasma processing apparatus 10 according to an exemplary embodiment. The plasma processing apparatus 10 in the present exemplary embodiment is configured as a DRM (Dipole Ring Magnet) type plasma processing apparatus. The plasma processing apparatus 10 in the present exemplary embodiment may be used for an etching or CVD (Chemical Vapor Deposition) using plasma, for example. The plasma processing apparatus 10 illustrated in FIG. 1 includes a cylindrical processing container 11. The processing container 11 is electrically grounded. The processing container 11 has a processing space S therein. Within the processing container 11, a cylindrical susceptor 12 is disposed as a placing table on which a wafer is mounted as a processing target substrate.

The inner wall surface of the processing container 11 is covered by a side wall member 45. The side wall member 45 is formed of, for example, aluminum, and a surface thereof facing the processing space S is coated with, for example, yttria ($Y_2O_3$). The susceptor 12 is installed on the bottom portion of the processing container 11 with an insulative member 29 interposed therebetween. A side surface of the susceptor 12 is covered with a susceptor side surface covering member 120.

The inner wall of the processing container 11 and the side surface of the susceptor 12 form an exhaust path 13 serving as a flow path that discharges gas molecules above the susceptor 12 to the outside of the processing container 11. In the midway of the exhaust path 13, an annular baffle plate 14 is disposed so as to prevent leakage of plasma. In addition, the space downstream of the baffle plate 14 in the exhaust path 13 extends around the lower side of the susceptor 12 to communicate with an APC (Adaptive Pressure Control) valve 15 that is a variable butterfly valve. The APC valve 15 is connected to a TMP (Turbo Molecular Pump) 17 serving as an exhaust pump for a vacuum processing via an isolator 16, and the TMP 17 is connected to a DP (Dry Pump) 18 serving as an exhaust pump via a valve V1.

An exhaust flow path formed by the APC valve 15, the isolator 16, the TMP 17, the valve V1 and the DP 18 performs a pressure control of the interior of the processing container 11, more specifically the processing space S by the APC valve 15. Furthermore, the exhaust flow path decompresses the interior of the processing container 11 to substantially a vacuum state by the TMP 17 and the DP 18.

In addition, a pipe 19 is connected between the APC valve 15 and the isolator 16, and the pipe 19 is connected to the DP 18 via a valve V2. The pipe 19 and the valve V2 bypass the TMP 17, and the interior of the processing container 11 is roughly evacuated by the DP 18.

A high frequency power supply 20 is connected to the susceptor 12 via a power feeding rod 21 and a matcher 22, and the high frequency power supply 20 supplies a high frequency power of, for example, 13.56 MHz to the susceptor 12. Thus, the susceptor 12 serves as a lower electrode. In addition, the matcher 22 reduces reflection of the high frequency power from the susceptor 12 to the high frequency power supply 20, thereby maximizing the supply efficiency of the high frequency power to the susceptor 12. The susceptor 12 applies the high frequency power of 13.56 MHz supplied from the high frequency power supply 20, to the processing space S.

At the upper side of the interior of the susceptor 12, a disc-shaped ECS (Electro-Static Chuck) electrode plate 23 formed of a conductive film is disposed. A DC power supply 24 is electrically connected to the ESC electrode plate 23. The wafer W is attracted to and held on the top surface of the susceptor 12 by a Coulomb force or a Johnson-Rahbek force generated by the DC voltage applied to the ESC electrode plate 23 from the DC power supply 24.

In addition, above the susceptor 12, an annular focus ring 25 is provided to surround the periphery of the wafer W attracted to and held on the top surface of the susceptor 12. The focus ring 25 is exposed to the processing space S so as to converge the plasma in the processing space S toward the surface of the wafer W so that the efficiency of a reactive ion etching (RIE) processing or an ashing processing is improved.

Within the susceptor 12, an annular coolant chamber 26 is provided to extend, for example, in the circumferential direction. A coolant such as, for example, cooling water having a predetermined temperature, is circulated and supplied to the coolant chamber 26 from a chiller unit (not illustrated) via a coolant pipe 27. The processing temperature of the wafer W attracted to and held on the top surface of the susceptor 12 is controlled by the temperature of the coolant.

On the top surface of the susceptor 12 where the wafer W is attracted to and held (hereinafter, referred to as an "attraction surface"), a plurality of gas supply holes 28 are provided. The plurality of gas supply holes 28 are connected to the gas supply unit 32 via a gas supply line 30 disposed inside the susceptor 12. The gas supply unit 32 supplies a heat transfer gas such as, for example, helium gas, to a gap between the attraction surface of the susceptor 12 and the rear surface of the wafer W through the gas supply holes 28.

A plurality of pusher pins 33 are arranged in the attraction surface of the susceptor 12 to serve as lift pins capable of protruding from the top surface of the susceptor 12. The pusher pins 33 are connected with a motor (not illustrated) through a ball screw, and are capable of protruding from the attraction surface due to the rotary motion of the motor which is converted into a rectilinear motion. When the wafer W is attracted to and held on the attraction surface so as to perform the RIE processing or the ashing processing on the wafer W, the pusher pins 33 are accommodated in the susceptor 12. In addition, when the wafer W is carried out from processing container 11 after the RIE processing or the ashing processing is performed on the wafer W, the pusher pins 33 protrude from the top surface of the susceptor 12 to separate the wafer W from the susceptor 12 and lift the wafer W upwardly.

On the ceiling portion of the processing container 11, a shower head 34 is disposed to face the susceptor 12. The shower head 34 includes a UEL (Upper ELectrode) 35, a UEL base 36, and a CEL (Cover ELectrode) 37. The shower head 34 is an example of the gas supply unit and the upper electrode. The UEL 35 is provided above the UEL base 36. The CEL 37 is formed in, for example, a disc shape, from a conductive material such as, for example, silicon. The CEL 37 is provided below the UEL base 36 and supported by the UEL base 36 from the upper side. The bottom surface of the CEL 37 is exposed to the processing space S, and the CEL 37 suppresses the reaction product generated by the plasma of the processing gas supplied to the processing space S from being adhered to the UEL base 36.

The UEL 35 and the UEL base 36 are formed of a conductive material such as, for example, aluminum. The UEL 35 and the UEL base 36 are electrically connected with each other, and grounded via the processing container 11. In the bottom surface of the UEL base 36, an insulative member is provided on the area where the CEL 37 is disposed. In the present exemplary embodiment, the insulative member provided on the bottom surface of the UEL base 36 is an anodic oxidation coating (alumite coating) formed on the bottom surface of the UEL base 36 by an anodic oxidation treatment. Thus, the UEL base 36 and the CEL 37 are electrically insulated from each other. The UEL base 36 is an example of the base member.

A buffer chamber 40 is provided between the UEL 35 and the UEL base 36. The UEL base 36 is formed with a plurality of gas holes 360, each of which is communicated with the buffer chamber 40. In addition, the CEL 37 is formed with a plurality of gas holes 370. One end of each gas hole 370 is communicated with one of the gas holes 360 of the UEL base 36, and the other end is communicated with the processing space S.

A gas introduction tube 41 is connected to the buffer chamber 40. A gas supply source 420 serving as a processing gas supply source is connected to the gas introduction tube 41 through the insulating member 42. The processing gas supplied from the gas supply source 420 is supplied to the buffer chamber 40 through the insulating member 42 and the gas introduction tube 41, and ejected to the processing space S through each of the gas holes 360 and 370.

The CEL 37 is connected to a connection cable 47 via a conductive connection member 51 formed of, for example, aluminum. The connection cable 47 is connected to a DC current power supply 49 through a filter 48 that blocks high frequency waves. The DC power supply 49 supplies, for example, a negative DC voltage to the CEL 37 via the filter 48, the connection cable 47, and the connection member 51. In addition, an insulating member 50 is provided between the connection member 51 and the UEL base 36 so that the connection member 51 and the UEL base 36 are insulated from each other. In addition, in the connection member 51, the surface which is in contact with the UEL 35 is subjected to the alumite treatment so that the connection member 51 and the UEL base 36 are insulated from each other.

In addition, an opening 43 for carrying-in/out a wafer W is provided in the inner wall of the processing container 11 at a position that corresponds to the height of the wafer W lifted upwardly from the susceptor 12 by the pusher pins. A gate valve 44 is provided on the opening 43 to open/close the opening 43.

In addition, a pair of upper and lower annular or concentric DRMs (Dipole Ring Magnets) 46 are mounted on the outer circumference of the side wall of the processing container 11. By the DRMs 46, a magnetic field in the in-plane direction of the wafer W is formed in the processing space S within the processing container 11.

Within the processing container 11 of the plasma processing apparatus 10, the magnetic field is formed in the processing space S between the susceptor 12 serving as the lower electrode and the shower head 34 serving as the upper electrode by the DRMs 46. In addition, when the high frequency power is applied from the high frequency power supply 20 through the susceptor 12, magnetron discharge occurs in the processing space S. Thus, the processing gas supplied from the shower head 34 is dissociated and turned into plasma so that, for example, ions or radicals are generated. In addition, by the generated ions or radicals, a plasma processing such as, for example, an RIE, is performed on the wafer W placed on the susceptor 12. The high frequency power supply 20 is an example of a plasma generation unit.

In addition, the operation of each component of the above-described plasma processing apparatus 10 is controlled by a CPU of a control unit (not illustrated) provided in the plasma processing apparatus 10, according to program corresponding to a plasma processing such as, for example, an RIE.

In the above-mentioned plasma processing apparatus 10, the plasma processing such as, for example, an RIE, is performed on the wafer W, and, at this time, the reaction product produced from the processing gas is adhered to, for example, the bottom surface of the CEL 37. The adhered reaction product causes particle pollution on the wafer W in a processing performed thereafter. For that reason, in order to remove the reaction product adhered to, for example, the bottom surface of the CEL 37, a cleaning processing is performed as follows.

In the cleaning processing, for example, oxygen gas is supplied into the processing space S from the shower head 34, and a high frequency power of, for example, 13.56 MHz, is applied to the processing space S supplied with the oxygen gas, from the susceptor 12. In the processing space S, for example, oxygen ions or oxygen radicals are generated by the high frequency power. For example, the oxygen ions or oxygen radicals react with the reaction product adhered to, for example, the bottom surface of the CEL 37 so that the reaction product is removed from, for example, the bottom surface of the CEL 37.

[Configuration of Shower Head 34]

Figure 2:
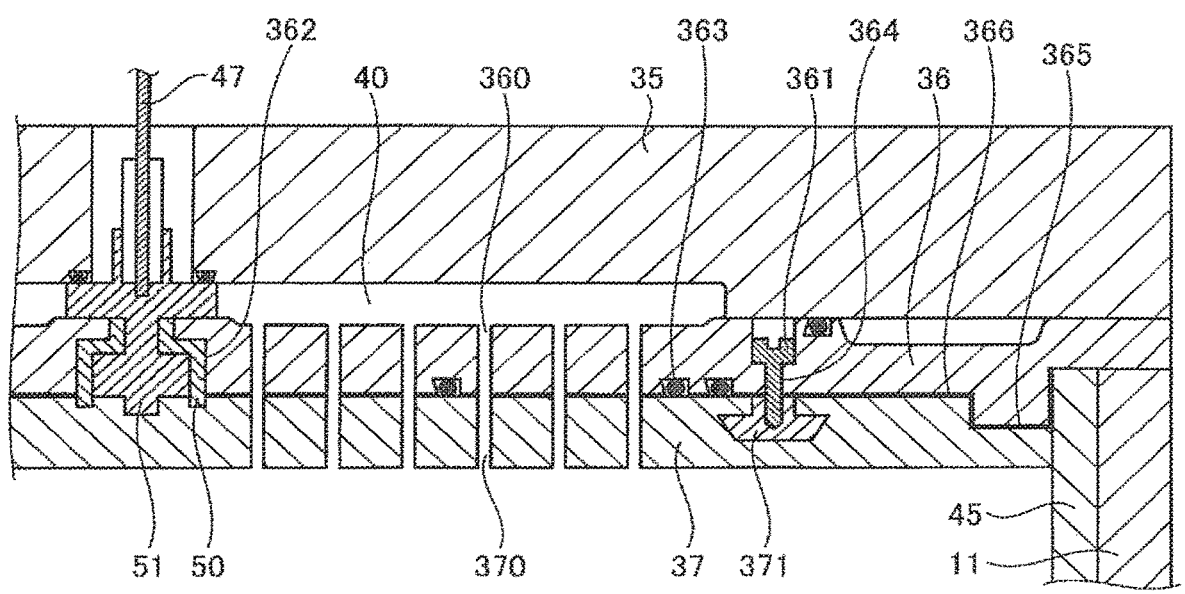
FIG. 2 is an enlarged cross-sectional view illustrating an exemplary shower head.

FIG. 2 is an enlarged cross-sectional view illustrating an exemplary shower head 34. The CEL 37 is provided with a bush 371 having a female screw formed therein. The CEL 37 is supported from the upper side thereof by a screw 361 inserted from the upper side of the UEL base 36 and fastened to the bush 371. The bush 371 and the screw 361 are formed of an insulative material. In addition, the screw 361 may be formed of a conductive material (e.g., aluminum), and the surface of the screw 361 may be covered by an insulative coating (e.g., an alumite coating).

In the bottom surface of the UEL base 36, an insulating portion 366 formed of an insulation material is provided on the surface where the CEL 37 is disposed. In the present exemplary embodiment, the insulating portion 366 is an anodic oxide coating (an alumite coating) formed on the bottom surface of the UEL base 36 by an anodic oxidation treatment. In the UEL base 36 where the CEL 37 is disposed, a plurality of irregularities such as, for example, an opening 362 into which the insulating member 50 and the connection member 51 are inserted, a recess 363 in which a seal member such as, for example, an O-ring is disposed, a screw hole 364 into which the screw 361 is inserted, and a protrusion 365, are formed as illustrated in FIG. 2, for example.

[Configuration of Conventional Plasma Processing Apparatus]

Figure 3:
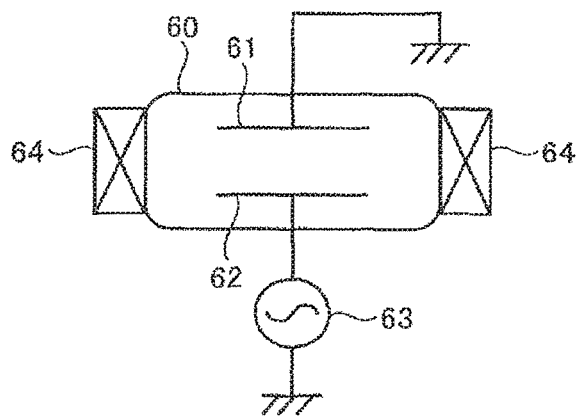
FIG. 3 is a schematic diagram illustrating an exemplary configuration of a conventional DRM type plasma processing apparatus.

Here, descriptions will be made on a schematic configuration of a conventional plasma processing apparatus. FIG. 3 is a schematic diagram illustrating an exemplary configuration of a conventional DRM type plasma processing apparatus. The conventional plasma processing apparatus is provided with an upper electrode 61 and a lower electrode 62 on which a wafer W is mounted, within a processing container 60. A DRM 64 is disposed on the outer circumference of the processing container 60. The upper electrode 61 has a dual configuration of a UEL and a CEL, and the CEL is disposed to face the lower electrode 62.

The UEL and the CEL of the upper electrode 61 are grounded together. A high frequency power having a predetermined frequency (e.g., 13.56 MHz) is applied to the lower electrode 62 from a high frequency power supply 63. As a result, magnetron discharge occurs between the upper electrode 61 and the lower electrode 62 to turn the processing gas supplied into the processing container 60) into plasma so that a plasma processing such as, for example, an RIE, is performed on the wafer W placed on the lower electrode 62 by, for example, ions or radicals. In addition, a reaction product produced from the processing gas is adhered to the bottom surface of the upper electrode 61.

In the plasma processing apparatus of FIG. 3, in order to remove the reaction product adhered to the CEL of the upper electrode 61, it is necessary to take out the CEL from the processing container 60. If the CEL is taken out from the processing container 60 whenever a wafer W is processed, the improvement of throughput of the process is disturbed.

Thus, there is known a cleaning method using a DC superposition (DCS) method in which a negative DC voltage is applied to the upper electrode 61 so as to induce either the ions or radicals generated by the plasma of the processing gas supplied into the processing container to cause the reaction product adhered to the bottom surface of the CEL of the upper electrode 61 to react with ions or radicals to be removed.

Figure 4:
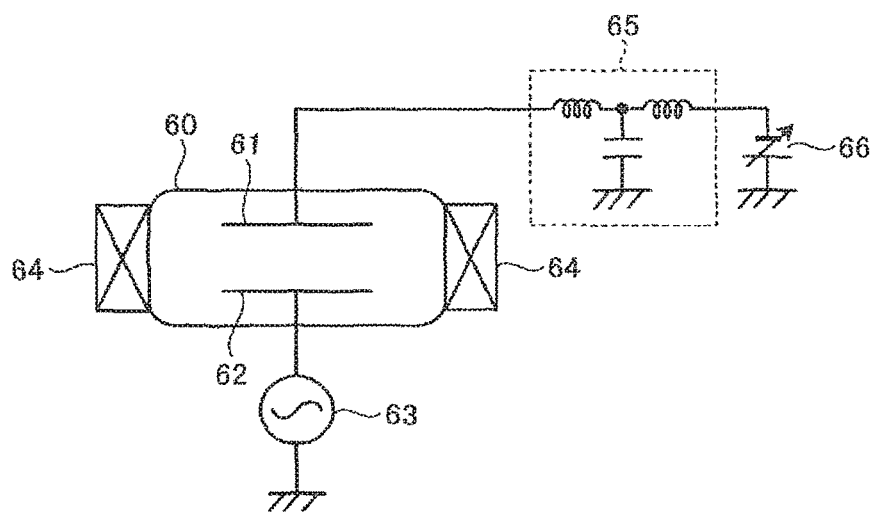
FIG. 4 is a schematic diagram illustrating an exemplary configuration of a DRM type plasma processing apparatus in which DCS (Direct Current Superposition) is incorporated.

FIG. 4 is a schematic diagram illustrating an exemplary configuration of a DRM type plasma processing apparatus in which DCS is incorporated. In the DRM type plasma processing apparatus in which the DCS is incorporated, the DC power supply 66 is connected to the upper electrode 61 through a filter 65. The DC power supply 66 applies a negative DC voltage to the upper electrode 61 via the filter 65. With the configuration as illustrated in FIG. 4, the ions or radicals generated by the plasma of the processing gas supplied into the processing container 60 are drawn to the upper electrode 61 so that the reaction product adhered to the CEL of the upper electrode 61 reacts with the ions or radicals to be removed.

As a result, it is enabled to remove the reaction product adhered to the CEL without taking out the CEL from the processing container 60. For that reason, the process throughput may be enhanced while preventing particle pollution.

Here, the high frequency power applied from the high frequency power supply 63 is propagated to the upper electrode 61 from the lower electrode 62 through the space within the processing container 60, and propagated to the ground from the upper electrode 61. However, in the plasma processing apparatus having the configuration exemplified in FIG. 4, the filter 65 is interposed between the upper electrode 61 and the ground, and a voltage drop caused by, for example, an inductor, occurs in the filter 65 by the high frequency power. For that reason, the potential of the upper electrode 61 in the high frequency power is higher than the ground voltage by the voltage drop in the filter 65 when viewed from the lower electrode 62. For that reason, the potential distribution in the space within the processing container 60 is different from that in the conventional plasma processing apparatus illustrated in FIG. 3.

In the case where a processing recipe has been established by finely adjusting various parameters such as, for example, a temperature, a pressure, a flow rate ratio of a processing gas, a high frequency power, and a processing time, in order to manufacture wafers W having desired characteristics using the plasma processing apparatus exemplified in FIG. 3, the processing recipe, which has been used up to now, cannot be applied when the plasma processing apparatus exemplified in FIG. 3 is modified to the plasma processing apparatus exemplified in FIG. 4. Otherwise, even if the processing recipe, which has been used up to now, is applied, it becomes impossible to manufacture a wafer W having characteristics equivalent to those of the wafers W which have been manufactured up to now using the plasma processing apparatus exemplified in FIG. 3.

Thus, in the present exemplary embodiment, the change in potential distribution in the space within the processing container 60 according to the addition of the DCS function to the configuration of the plasma processing apparatus exemplified in FIG. 3 is suppressed to be low. Thus, even in the case where an adjusted previous processing recipe is used for the plasma processing apparatus having the configuration exemplified in FIG. 3, it is enabled to manufacture a wafer W having characteristics equivalent to those obtained prior to adding the DCS function. That is, it is enabled to secure a process trace.

[Configuration of Plasma Processing Apparatus 10 of Present Exemplary Embodiment]

Figure 5:
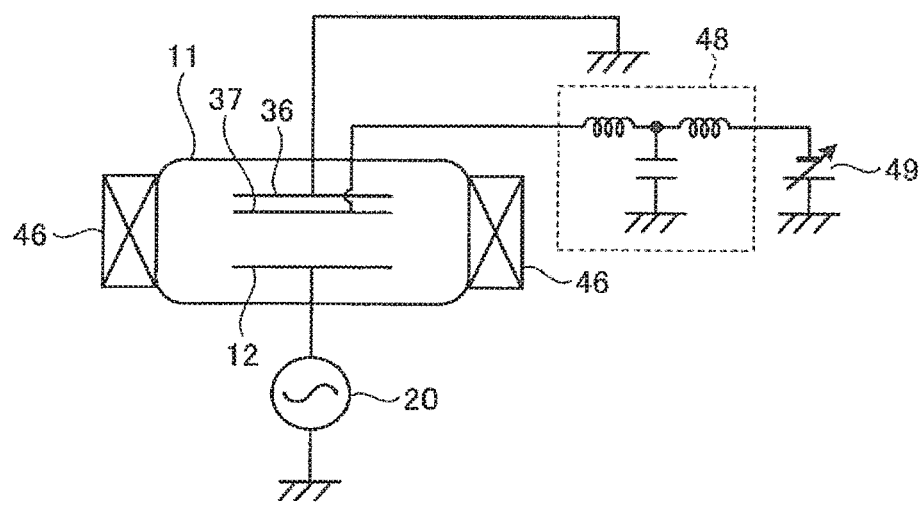
FIG. 5 is a schematic diagram illustrating an exemplary configuration of a plasma processing apparatus according to an exemplary embodiment of the present disclosure.

FIG. 5 is a schematic diagram illustrating an exemplary configuration of a plasma processing apparatus 10 according to an exemplary embodiment of the present disclosure. In the plasma processing apparatus 10 of the present exemplary embodiment, the UEL base 36 and the CEL 37 are insulated from each other, the UEL base 36 is grounded, a negative DC voltage is applied to the CEL 37. In the high frequency power, the CEL 37 has a potential higher than the ground potential by a voltage drop caused by the inductor within the filter 48.

Since the UEL base 36, which is wider than the CEL 37, is connected to the ground potential, most of the high frequency power applied from the susceptor 12 is propagated to the ground through the UEL base 36. Thus, the CEL 37 hardly has an effect on the propagation of the high frequency power. Thus, the potential distribution within the processing container 11 in the high frequency power becomes substantially equal to that in the configuration of FIG. 3 in which the UEL base 36 and the CEL 37 are electrically connected with each other and grounded.

Accordingly, even if a processing recipe adjusted to be suitable for the plasma processing apparatus having the configuration exemplified in FIG. 3 is used, the plasma processing apparatus 10 according to the present exemplary embodiment enables manufacturing of a wafer W having the characteristics equivalent to those obtained prior to adding the DCS function. That is, it is enabled to secure a process trace.

[DC Voltage Range]

Figure 6:
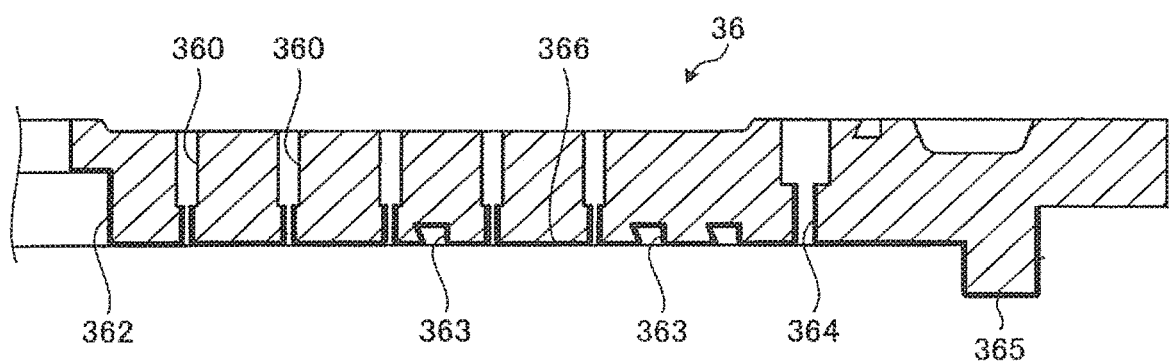
FIG. 6 is an enlarged cross-sectional view illustrating an exemplary shape of a UEL (Upper ELectrode) base.

Next, the range of a negative DC voltage applied to the CEL 37 will be reviewed. FIG. 6 is an enlarged cross-sectional view illustrating an exemplary shape of the UEL base 6. FIG. 6 illustrates a right half of the UEL base 36 in FIG. 1. As illustrated in FIG. 6, the UEL base 36 is formed with, for example, an opening 362 into which the insulating member 50 and the connection member 51 are inserted, a recess 363 in which a seal member such as, for example, an O-ring, a screw hole 364 into which a screw 361 is inserted, and a protrusion 365.

In the present exemplary embodiment, the insulating portion 366 formed on the bottom surface of the UEL base 36, on which the CEL 37 is placed, is, for example, an anodic oxide coating (an alumite coating). The UEL base 36 and the CEL 37 are insulated from each other by the insulating portion 366. However, when a protruding corner rounding formed on the bottom surface of the UEL base 36 is small (when the radius of the rounding is short), the insulating portion 366 may not be formed with a desired thickness in some cases. At the corner having a small rounding, the insulating portion 366 may be formed with a thin thickness. For that reason, in the present exemplary embodiment, a rounding having a size equal to or larger than a predetermined value (a radius equal to or larger than a predetermined value) is formed on a protruding corner formed on the bottom surface of the UEL base 36.

On the bottom surface of the UEL base 36, the insulating portion 366 is formed to have a thickness of, for example, about dozens of micrometers (μm). In the present exemplary embodiment, on the bottom surface of the UEL base 36, the insulating portion 366 is formed to have a thickness of, for example, about 50 μm. The thickness of the insulating portion 366 may be in a range of 20 μm or more and 100 μm or less.

Figure 7:
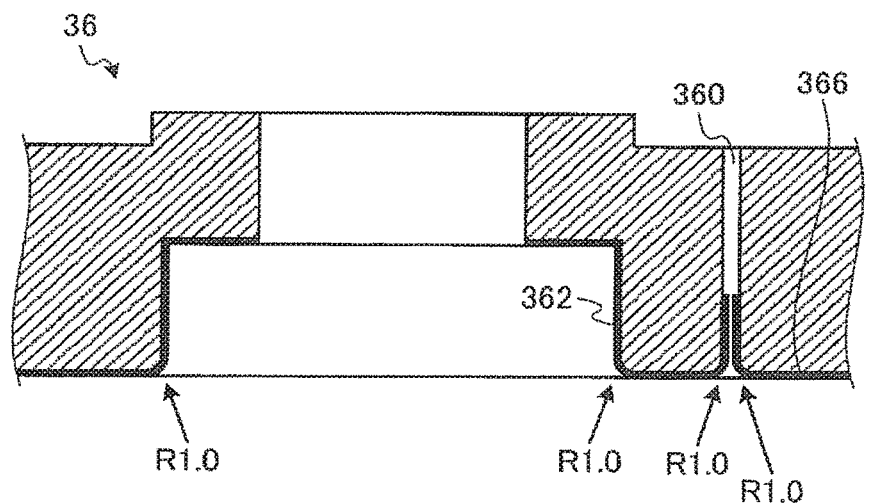
FIG. 7 is an enlarged cross-sectional view illustrating an exemplary shape of a vicinity of an opening of the UEL base.

FIG. 7 is an enlarged cross-sectional view illustrating an exemplary shape of a vicinity of an opening 362 of the UEL base 36. At the corner between the opening 362 of the UEL base 36 and the bottom surface of the UEL base 36, a rounding having a sectional shape of, for example, R1.0 (circular radius of 1 mm) is formed as illustrated in FIG. 7, for example. In addition, even at the corner between the gas hole 360 of the UEL base 36 and the bottom surface of the UEL base 36, a rounding having a sectional shape of, for example, R1.0 (circular radius of 1 mm) is formed as illustrated in FIG. 7, for example.

Figure 8:
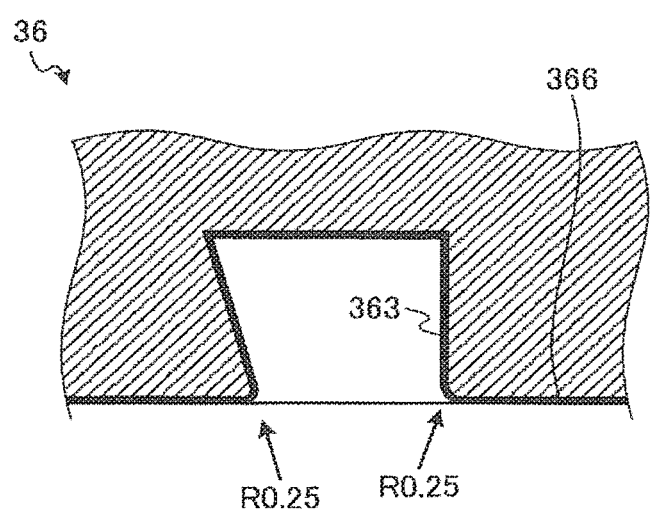
FIG. 8 is an enlarged cross-sectional view illustrating an exemplary shape of a recess, in which a seal material is disposed.

FIG. 8 is an enlarged cross-sectional view illustrating an exemplary shape of a recess 363, in which a seal material is disposed. The recess 363 is formed around the opening 362, for example, in a circular shape to surround the opening 362. At the corner between the recess 363 and the bottom surface of the UEL base 36, a rounding having a sectional shape of, for example, R0.25 (circular radius of 0.25 mm) is formed as illustrated in FIG. 8, for example.

Figure 9:
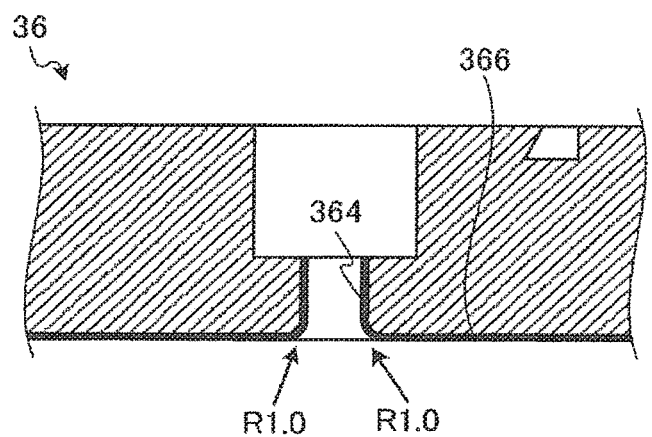
FIG. 9 is an enlarged cross-sectional view illustrating an exemplary shape of a screw hole.

FIG. 9 is an enlarged cross-sectional view illustrating an exemplary shape of a screw hole 364. At the corner between the screw hole 364 and the bottom surface of the UEL base 36, a rounding having a sectional shape of, for example, R1.0 (circular radius of 1 mm) is formed as illustrated in FIG. 9, for example.

Figure 10:
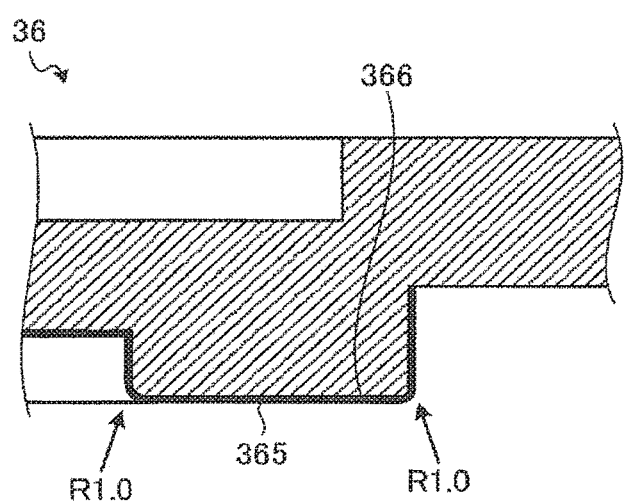
FIG. 10 is an enlarged cross-sectional view illustrating an exemplary shape of a protrusion of the UEL base.

FIG. 10 is an enlarged cross-sectional view illustrating an exemplary shape of a protrusion 365 of the UEL base 36. At the corners of the protrusion 365, a rounding having a sectional shape of, for example, R0.5 (circular radius of 0.5 mm) is formed as illustrated in FIG. 10, for example.

Figure 11:
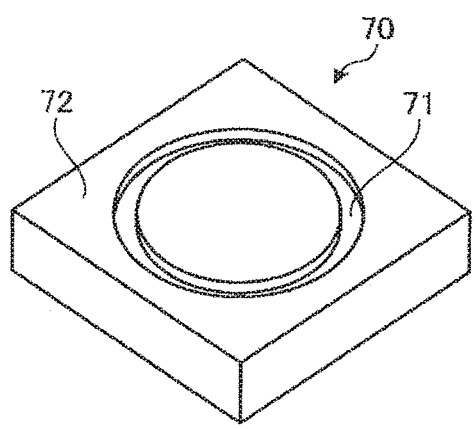
FIG. 11 is a view illustrating an exemplary shape of a test piece.

Next, descriptions will be made on a test result obtained by measuring a withstanding voltage in a case where an anodic oxide coating is formed as the insulating portion 366 on a surface of each of the members formed with rounded corners as illustrated FIGS. 7 to 10. FIG. 11 is a view illustrating an exemplary shape of a test piece 70. The test piece 70 is formed of the same material as the UEL base 36

(e.g., aluminum). On the test piece 70, three kinds of features of a recess having a corner rounding R0.25, a hole having a corner rounding R1.0, and a flat surface are formed. FIG. 11 exemplifies a test piece 70 in which a recess 71 is formed on a surface 72. The surface 72 of the test piece 70 is formed with an anodic oxide coating having a thickness of 50 μm.

Figure 12:
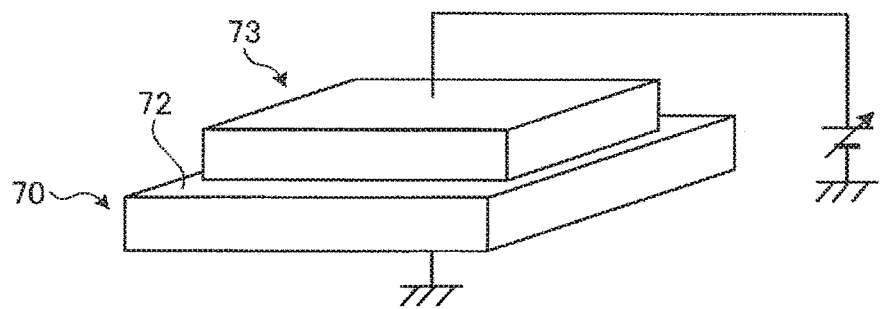
FIG. 12 is an explanatory view for describing an exemplary configuration of a test.

FIG. 12 is an explanatory view for describing an exemplary configuration of a test. In the test, as illustrated in FIG. 12, a member 73 formed of the same conductive material as the CEL 73 (e.g., silicon) was made to be in contact with the surface 72 formed with an anodic oxide coating. In addition, the test piece 70 was grounded, the DC voltage applied to the member 73 was increased, and a voltage of causing the initiation of electric discharge was measured as the withstanding voltage.

FIG. 13 is a view representing an exemplary test result of a withstanding voltage. In the test, ten (10) test pieces 70 were prepared for each of a recess, a flat surface, and a hole, and a withstanding voltage was measured for each of the test pieces. In the test pieces 70 formed with a recess, the corner rounding between the recess and the surface of each test piece 70 is R0.25. In addition, in the test pieces 70 formed with a hole, the corner rounding between the hole and the surface of each test piece 70 is R1.0.

As illustrated in FIG. 13, the withstanding voltages of the recesses are low as compared to those of either the flat surfaces or the holes as a whole. It is considered that, since the radii of the corner roundings between the recesses and the surfaces of the test pieces 70 are smaller than the radii of the corner roundings between the holes and the surfaces of the test pieces 70, the thicknesses of the anodic oxide coatings at the corners between the recesses and the surfaces of the test pieces 70 were thinned. The minimum value of the withstanding voltages of the recesses was 730 V.

From the test result of FIG. 13, in the UEL base 36 having the shape illustrated in FIG. 6, it has been found that, in the case where an anodic oxide coating having a thickness of 50 μm is provided on the surface where the UEL base 36 is in contact with the CEL 37, and the UEL base 36 is grounded, no discharge occurs when the DC voltage is applied to the CEL 37 is −730 V or more. For that reason, the DC voltage applied to the CEL 37 may be −730 V or more.

[Relationship Between DC Voltage and Removal Rate of Adhered Product]

Next, a test was performed in relation to the relationship between the DC voltage applied to the CEL 37 and the removal rate of the reaction product adhered to the CEL 37. FIG. 14 is a view representing an exemplary test result of the removal rate of the adhered product in relation to the DC voltage applied to the CEL 37.

As illustrated in FIG. 14, in the case where the adhered substance is, for example, aluminum (Al), when the voltage was −150 V or less, a removal rate of 99% or more of the adhered product was obtained. In addition, in the case where the adhered product is hafnium (Hf), when the voltage was −50 V or less, a removal rate of 99% or more of the adhered product was obtained. Besides, as a result of performing the test on the adhered product of a transition metal such as, for example, tantalum (Ta) or titanium (Ti), it has been found that, when the voltage was −150 V or less, the removal rate of the adhered product containing the transmission metal element is 99% or more.

Accordingly, upon considering the test result of withstanding voltage of FIG. 13, the range of the negative DC voltage applied to the CEL 37 may be in the range of higher than −730 V and −150 V or less. Although the test was performed in the state where the radii of the protruding corner roundings were in the range of R0.25 to R1.0, the radii of protruding corner roundings in the UEL base 36 may be R0.2 or more and R1.0 or less.

[Cleaning Sequence]

Figure 15:
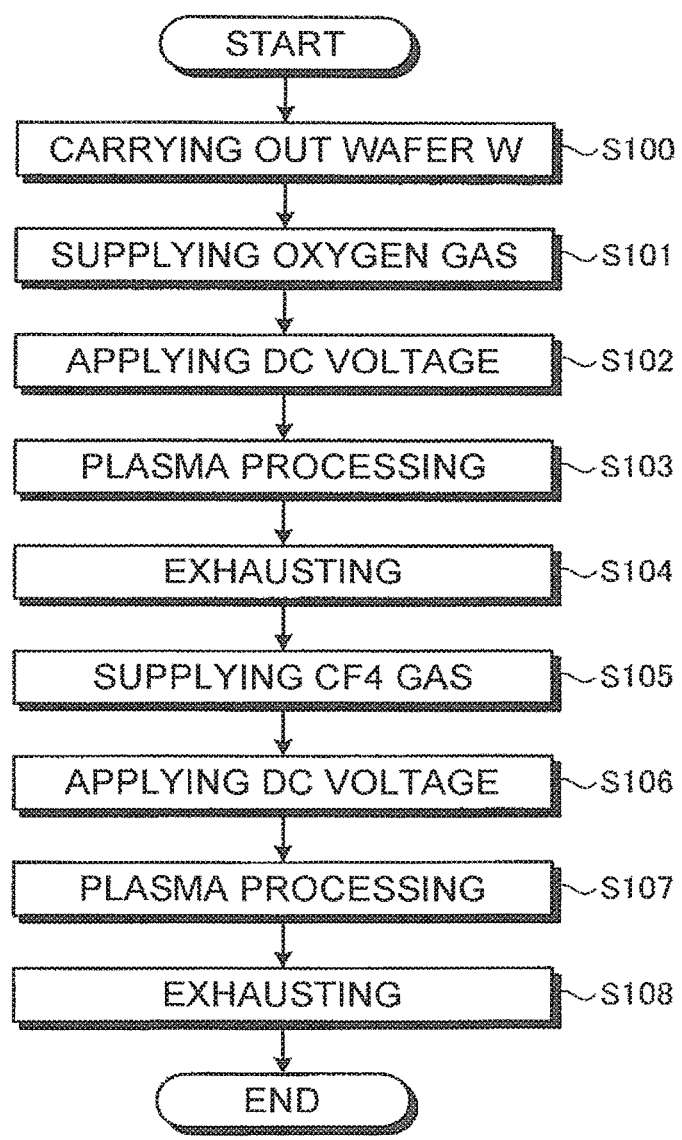
FIG. 15 is a flowchart illustrating an exemplary cleaning sequence of the CEL.

FIG. 15 is a flowchart illustrating an exemplary cleaning sequence of the CEL.

First, a wafer W subjected to a processing such as, for example, an RIE, is carried out from the processing container 11 (S100). Then, for example, oxygen gas is supplied to the inside of the processing space S from the gas supply source 420 through the shower head 34 (S101). In addition, a negative DC voltage in the range of −730 V to −150 V (e.g., −150 V) is applied from the DC power supply 49 to the CEL 37 (S102).

Next, a high frequency power of, for example, 13.56 MHz is applied from the high frequency power supply 20 to the processing space S through the susceptor 12. As a result, magnetron discharge occurs within the processing space S. In addition, the oxygen gas within the processing space S is dissociated and turned into plasma so that oxygen ions or oxygen radicals are generated. Then, the bottom surface of the CEL 37 is subjected to a plasma processing by the generated oxygen ions or the oxygen radicals (S103). More specifically, the reaction product adhered to the bottom surface of the CEL 37 is removed by being decomposed by the generated oxygen ions or oxygen radicals. In addition, when the oxygen gas is used as the processing gas, an oxide is formed on the bottom surface of the CEL 37 by the oxygen ions.

Next, the application of the negative DC voltage to the CEL 37 from the DC power supply 49 is stopped. In addition, for example, the gas of the reaction product decomposed by, for example, the oxygen ions or oxygen radicals in the processing space S is exhausted through the exhaust path 13 (S104).

Next, for example, the gas of carbon tetrafluoride ($CF_4$) is supplied to the inside of the processing space S from the gas supply source 420 through the shower head 34 (S105). Then, a negative DC voltage in the range of −730 V to −150 V (e.g., −150 V) is applied again to the CEL 37 from the DC power supply 49 (S106).

Next, a high frequency power of, for example, 13.56 MHz is applied to the processing space S from the high frequency power supply 20 through the susceptor 12. As a result, magnetron discharge occurs within the processing space S, the $CF_4$ gas within the processing space S is turned into plasma so that fluorine ions or fluorine radicals are generated. Then, the bottom surface of the CEL 37 is subjected to a plasma processing by the generated fluorine ions or fluorine radicals (S107). More specifically, the oxide formed on the bottom surface of the CEL 37 is decomposed and removed by the fluorine ions or radicals.

Next, the application of the negative DC voltage to the CEL 37 from the DC power supply 49 is stopped. Then, for example, the gas of the reaction product decomposed by, for example, the fluorine ions or fluorine radicals within the processing space S is exhausted through the exhaust path 13 (S108).

In the foregoing, exemplary embodiments have been described. According to the plasma processing apparatus 10 of the exemplary embodiments, an effect according to the addition of a cleaning function to an existing plasma processing apparatus on a process may be suppressed to be low.

The present disclosure is not limited to the above-described exemplary embodiments and a number of modifications may be made within the scope of the present disclosure.

For example, in the above-described exemplary embodiments, although the filter 48 is provided between the CEL 37 and the DC power supply 49, the present disclosure is not limited thereto. In another exemplary embodiment, the CEL 37 and the DC power supply 49 may be connected with each other without the filter 48 interposed therebetween. As such, since it is not necessary to provide the filter 48 to the plasma processing apparatus 10, the number of components of the plasma processing apparatus 10 may be reduced.

In the above-described exemplary embodiment, although the insulating portion 366 provided between the UEL base 36 and the CEL 37 is an anodic oxide coating formed on the bottom surface of the UEL base 36, the present disclosure is not limited thereto. For example, a plate-shaped member formed of an insulative material may be mounted between the UEL base 36 and the CEL 37 as the insulating portion 366. Alternatively, an insulative film may be formed on the top surface of the CEL 37 which is in contact with the UEL base 36.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
a processing container;
a gas supply source configured to supply a processing gas into the processing container;
a placing table configured to serve as a lower electrode and mount a processing target substrate thereon;
an upper electrode provided above the placing table;
a high frequency power supply configured to generate plasma of the processing gas within the processing container by applying a high frequency power to the placing table; and
a direct current (DC) power supply configured to apply a DC voltage to the upper electrode,
wherein the upper electrode includes:
(i) a base member,
(ii) a cover member provided on the base member at a side of the placing table, and
(iii) an insulating portion provided between the base member and the cover member so as to insulate the base member and the cover member,
wherein the DC power supply applies the DC voltage to the cover member, and
wherein the base member includes a protruding corner rounding formed on the placing table side surface of the base member, the insulating portion is an insulative coating formed on the placing table side surface of the base member, and the insulating portion extends over the protruding corner rounding of the base member.

2. The plasma processing apparatus according to claim 1, wherein the base member includes a first side facing toward the placing table and a second side opposite to the first side,
wherein the cover member includes a first side facing toward the first side of the base member and a second side opposite to the first side, and the second side of the cover member faces toward the placing table, and
wherein the base member includes a plurality of openings having respective inlets on the first side of the base member, and the protruding corner rounding is provided at each of the inlets of the openings.

3. The plasma processing apparatus according to claim 2, wherein the protruding corner rounding of the base member protrudes in a direction to reduce a size of each opening at each inlet such that a size of each opening at the inlet is smaller than a size at a location inside of the opening spaced from the inlet, and the insulating portion covers the protruding corner rounding of the base member.

4. The plasma processing apparatus according to claim 3, wherein the insulative coating of the insulating portion extends over the protruding corner rounding and into the opening of the base member.

5. The plasma processing apparatus according to claim 4, wherein the openings are recesses which extend only partially through the base member, and
the first side of the cover member covers the inlets of the recesses such that the recesses are not exposed to a processing space of the processing container.

6. The plasma processing apparatus according to claim 5, further including a seal provided inside of each of the recesses, and the seal is a separate part from the insulating portion.

7. The plasma processing apparatus according to claim 1, wherein the base member includes a first side facing toward the placing table and a second side opposite to the first side,
wherein the cover member includes a first side facing toward the first side of the base member and a second side opposite to the first side, and the second side of the cover member faces toward the placing table,
wherein the base member includes an opening having an inlet on the first side of the base member, and the protruding corner rounding is provided at the inlet of the opening of the base member, and
wherein the insulating portion covers the protruding corner rounding of the base member and extends into the opening of the base member.

8. The plasma processing apparatus according to claim 7, wherein the protruding corner rounding protrudes to reduce a size of the opening at the inlet such that a size of the opening at the inlet is smaller than a size of the opening at a location spaced from the inlet,
a seal is positioned inside of the opening, and the seal is a separate part from the insulating portion, and
the first side of the cover member covers the inlet of the opening on the first side of the base member.

9. The plasma processing apparatus according to claim 1, wherein the cover member is a cover electrode, and wherein DC power is applied to the cover electrode by a DC power connection which is connected to the DC power supply and which extends through the base member, and wherein an insulation is provided between the base member and the DC power connection.

10. A plasma processing apparatus comprising:
a processing container;
a gas supply source configured to supply a processing gas into the processing container;
a placing table configured to serve as a lower electrode and mount a processing target substrate thereon;
an upper electrode provided above the placing table;
a high frequency power supply configured to generate plasma of the processing gas within the processing container by applying a high frequency power to the placing table; and a direct current (DC) power supply configured to apply a DC voltage to the upper electrode, wherein the upper electrode includes:
(i) a base member having a first side facing in a direction toward the placing table and a second side, with the second side an opposite side of the base member with respect to the first side and facing in a direction away from the placing table,
(ii) a cover member provided on the first side of the base member, and
(iii) an insulating portion provided on the first side of the base member and between the base member and the cover member so as to insulate the base member and the cover member, wherein the DC power supply applies the DC voltage to the cover member, and wherein the base member includes an opening on the first side of the base member, a corner rounding formed at the opening on the first side of the base member, the insulating portion is an insulative coating formed on the first side of the base member, and the insulating portion extends over the corner rounding and into the opening on the first side of the base member.

11. The plasma processing apparatus according to claim 10, wherein the corner rounding of the base member is a protruding corner rounding which is covered by the insulating portion, and the protruding corner rounding protrudes in a direction to narrow a size of the opening at an inlet of the opening on the first side of the base member such that a size of the opening at the inlet is smaller than a size of the opening at a location spaced from the inlet.

12. The plasma processing apparatus according to claim 11, wherein the opening is a recess which extends only partially through the base member.

13. The plasma processing apparatus according to claim 12, wherein the cover member includes a first side facing toward the first side of the base member and a second side facing toward the placing table, and wherein the first side of the cover member covers the inlet of the opening such that the opening is not exposed to a processing space in the processing container.

14. The plasma processing apparatus according to claim 10, wherein the cover member includes a first side facing toward the first side of the base member and a second side facing toward the placing table, and wherein the first side of the cover member covers an inlet of the opening, such that the opening is not exposed to a processing space in the processing container.

15. The plasma processing apparatus according to claim 10, wherein the opening is an aperture which extends completely through the base member from the first side of the base member to the second side of the base member.

16. The plasma processing apparatus according to claim 10, wherein a plurality of openings are provided, a seal is provided in each of the openings, and the cover member covers inlets of each of the openings on the first side of the base member such that the inlets are not exposed to a processing space of the processing container, and each seal is a separate part from the insulating portion.

17. The plasma processing apparatus according to claim 16, wherein the corner rounding of the base member is a protruding corner rounding which protrudes in a direction to narrow a size of each opening at an inlet of each opening on the first side of the base member such that a size of the opening at the inlet is smaller than a size of the opening at a location spaced from the inlet, and the insulating portion covers the protruding corner rounding of the base member.

18. The plasma processing apparatus according to claim 10, wherein the cover member is a cover electrode, and wherein DC power is applied to the cover electrode by a DC power connection which is connected to the DC power supply and which extends through the base member, and wherein an insulation is provided between the base member and the DC power connection.

19. The plasma processing apparatus according to claim 10, wherein a plurality of openings are provided, the plurality of openings including:
a plurality of recesses extending from the first side of the base member and only partially through the base member, each recess including the corner rounding at a recess inlet on the first side of the base member, and the insulating portion covers the corner rounding of the base member and extends into the recess; and
a plurality of apertures extending completely through the base member, each aperture including the corner rounding at an aperture inlet of the first side of the base member and the insulating portion extends over the corner rounding,
wherein the cover member covers each of the recesses on the first side of the base member such that the recesses are not exposed to a processing space of the processing container, and
wherein the cover member includes a plurality of apertures aligned with the plurality of apertures of the base member.

20. The plasma processing apparatus according to claim 19, further including a seal positioned in each of the recesses, and the seal is a separate part from the insulating portion.

* * * * *